(12) United States Patent
Cheng et al.

(10) Patent No.: US 8,167,523 B2
(45) Date of Patent: May 1, 2012

(54) SINGULATION HANDLER COMPRISING VISION SYSTEM

(75) Inventors: Chi Wah Cheng, Hong Kong (HK); Lap Kei Eric Chow, Hong Kong (HK)

(73) Assignee: ASM Assembly Automation Ltd, Hong Kong (HK)

( * ) Notice: Subject to any disclaimer, the term of this patent is extended or adjusted under 35 U.S.C. 154(b) by 687 days.

(21) Appl. No.: 11/777,000

(22) Filed: Jul. 12, 2007

(65) Prior Publication Data

US 2009/0016868 A1    Jan. 15, 2009

(51) Int. Cl.
*H01L 21/304* (2006.01)

(52) U.S. Cl. ............... 414/222.12; 83/13; 125/13.01

(58) Field of Classification Search ........... 414/752.1, 414/787, 222.01, 222.12; 83/13, 35; 125/13.01
See application file for complete search history.

(56) References Cited

U.S. PATENT DOCUMENTS

| | | | | |
|---|---|---|---|---|
| 4,749,329 A | * | 6/1988 | Stout | 414/627 |
| 5,084,959 A | * | 2/1992 | Ando et al. | 29/740 |
| 5,694,219 A | * | 12/1997 | Kim | 356/615 |
| 5,946,409 A | * | 8/1999 | Hori | 382/149 |
| 5,962,862 A | * | 10/1999 | Evers et al. | 250/559.4 |
| 6,422,801 B1 | * | 7/2002 | Solomon | 414/416.07 |
| 6,435,808 B1 | * | 8/2002 | Araya et al. | 414/783 |
| 6,467,670 B2 | * | 10/2002 | Higashi et al. | 228/1.1 |
| 6,826,986 B2 | | 12/2004 | Lim et al. | 83/13 |
| 6,863,109 B2 | * | 3/2005 | Kim et al. | 156/556 |
| 6,915,561 B2 | * | 7/2005 | Yokoyama et al. | 29/740 |
| 7,511,522 B2 | * | 3/2009 | Ito et al. | 324/758 |
| 7,692,440 B2 | * | 4/2010 | Chew et al. | 324/765 |
| 2002/0184982 A1 | | 12/2002 | Smith et al. | 83/39 |
| 2006/0091126 A1 | * | 5/2006 | Baird et al. | 219/121.72 |
| 2008/0014073 A1 | * | 1/2008 | Moore et al. | 414/796 |
| 2008/0213975 A1 | * | 9/2008 | Yang | 438/460 |
| 2009/0124178 A1 | * | 5/2009 | Ueyama et al. | 451/91 |
| 2009/0202333 A1 | * | 8/2009 | Ozono et al. | 414/800 |

* cited by examiner

*Primary Examiner* — Charles A Fox
(74) *Attorney, Agent, or Firm* — Ostrolenk Faber LLP

(57) ABSTRACT

Singulation handler is provided which comprises a loading zone where a carrier mechanism receives and holds an electronic component and a singulation zone where the electronic component held by the carrier mechanism is singulated. A loader that is movable along an axis is operative to place the electronic component onto the carrier mechanism when it is situated in the loading zone and a vision system that is movable along substantially the same axis as the loader is operative to obtain at least one image of the electronic component showing alignment information so that the electronic component can be properly aligned during singulation.

9 Claims, 9 Drawing Sheets

SINGULATION HANDLER COMPRISING VISION SYSTEM

FIELD OF THE INVENTION

The present invention relates to a singulation system for cutting and separating electronic components, and in particular, to a handler for a singulation system that transports the electronic components for singulation.

BACKGROUND AND PRIOR ART

A singulation system for singulation or dicing electronic components, such as semiconductor substrates or packaged semiconductor devices, comprises at least a spindle system and a carrier support such as a chuck table. The axis of the spindle system is orthogonal to the axis of the chuck table and a theta axis table is located on top of the chuck table. The spindle system typically includes either one or two high speed rotating shafts with a sawing blade each. In a dual spindle system, two parallel spindles are arranged either face to face or next to each other.

Dicing may be performed on the semiconductor substrate in one direction by moving the chuck table under a spindle axis while the sawing blade is cutting the semiconductor substrate on a carrier, such as a saw jig, on the theta axis table of the chuck table. The spindle axis may index line by line to complete all the cutting lines required in one direction. Next, the theta table on the chuck table rotates 90 degrees about the theta axis to perform dicing in a direction orthogonal to the first direction. Thus, the semiconductor substrate is singulated into rectangular units.

For increased dicing accuracy, a pattern recognition (PR) camera is mounted on the spindle to recognize alignment marks on the semiconductor substrate before dicing. In this way, accurate dicing can be achieved by determining and adjusting an alignment of the substrate and adjusting its offset in the X-Y-θ axes prior to dicing. There is however a drawback in using a PR camera mounted on the spindle in that the working sequence from substrate loading, PR alignment, dicing to unloading is sequential. This prolongs the cycle time for dicing a substrate. One way to reduce the cycle time is to have a separate vision station for PR alignment. The separate station is located either at one end of a singulation zone for sawing or in between the singulation zone and a loading/unloading zone.

FIG. 1 is a functional block diagram illustrating a conventional bi-directional singulation system 100 with a singulation zone 41 located between a loading/unloading zone 42 and a vision alignment zone 40. A separate vision system 39 for PR alignment is used in this singulation system 100. After a first substrate is loaded onto a saw jig of a first chuck table 37 at the substrate loading/unloading station 12, it moves to the vision alignment zone 40 along a first axis 35 or a second axis 36 for imaging and alignment before proceeding to the dual spindles 34 for dicing. At the same time, a second substrate on a second chuck table 38 may be sawn at the dual spindles 34. A disadvantage of this approach is that the water for cooling the sawing blades and the washed away debris from dicing the second substrate may contaminate the first substrate as it passes through the singulation zone 41.

Another disadvantage of this singulation system 100 is that an additional motion axis is required for moving the vision alignment camera in the separate vision alignment zone 40. This means increased costs and additional space required for incorporating mechanisms to move the vision alignment camera along that axis. Furthermore, cycle time is increased as each semiconductor substrate has to move some distance from the substrate loading/unloading station 12 to the vision alignment zone 40 for positioning before dicing. One prior art document which uses the singulation system described above is US Patent Publication No. US 2002/0184982 A1 entitled "Bidirectional Singulation Saw and Method".

FIG. 2 is a functional block diagram illustrating a conventional bi-directional singulation system 110 with a vision alignment zone 40 located between a singulation zone 41 and a loading/unloading zone 42. A separate vision system 39 for PR alignment is also used in this system. Unlike the above singulation system, the vision alignment zone 40 is located between the singulation zone 41 and the loading/unloading zone 42. Thus, the substrates do not have to pass through the singulation zone 41 for vision alignment at the vision alignment zone 40. As such, this system has an advantage over the aforesaid conventional singulation system 100 in that the substrates are not contaminated by water and washed away debris in the singulation zone 41. However, this system also exhibits some of the disadvantages of the aforesaid singulation system 100 as an additional motion axis is still required for moving the vision alignment camera in the separate vision alignment zone 40 and the semiconductor substrates are still required to move some distance from the substrate loading/unloading station 12 to the vision alignment zone 40 for positioning before dicing. A prior art example of such a singulation system is found in U.S. Pat. No. 6,826,986 B2 entitled "Bidirectional Singulation System and Method".

Therefore, it would be desirable to minimise cost and space requirements in singulation systems for electronic components by eliminating the additional motion axis for separately moving the vision alignment system. It would also be desirable to further shorten the cycle time of the process.

SUMMARY OF THE INVENTION

It is thus an object of this invention to seek to achieve a vision assisted singulation handler system which provides imaging of substrates for pre-singulation alignment with reduced cycle time and at lower cost as compared to the aforesaid prior art.

According to a first aspect of the invention, there is provided a singulation handler comprising: a loading zone where a carrier mechanism receives and holds an electronic component; a singulation zone where the electronic component held by the carrier mechanism is singulated; a loader that is movable along an axis for placing the electronic component onto the carrier mechanism when it is situated in the loading zone; and a vision system that is movable along substantially the same axis as the loader to obtain at least one image of the electronic component showing alignment information.

According to a second aspect of the invention, there is provided a method of handling an electronic component for singulation, comprising the steps of: using a loader that is movable along an axis to place the electronic component onto a carrier mechanism that is situated in a loading zone; obtaining at least one image of the electronic component showing alignment information with a vision system that is movable along substantially the same axis as the loader; and thereafter moving the electronic component to a singulation zone and singulating the electronic component held by the carrier mechanism in the singulation zone.

It would be convenient hereinafter to describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of a preferred embodiment of the invention when considered with the accompanying drawings, in which.

DETAILED DESCRIPTION OF THE PREFERRED EMBODIMENT OF THE INVENTION

The preferred embodiment of the present invention will be described hereinafter with reference to the accompanying drawings.

Figure 1:
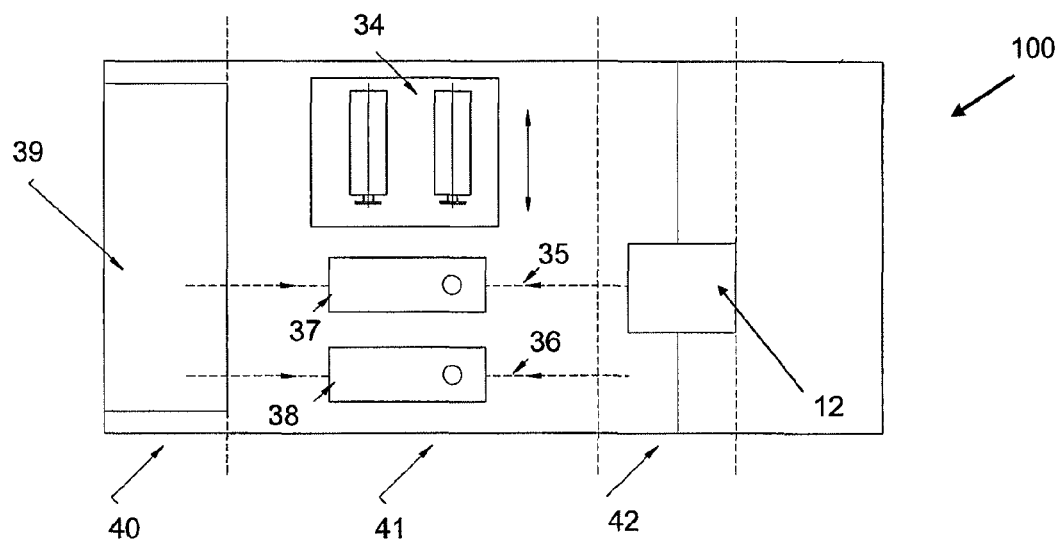
FIG. 1 is a functional block diagram illustrating a conventional bi-directional singulation system with a singulation zone located between a loading/unloading zone and a vision alignment zone.
Figure 2:
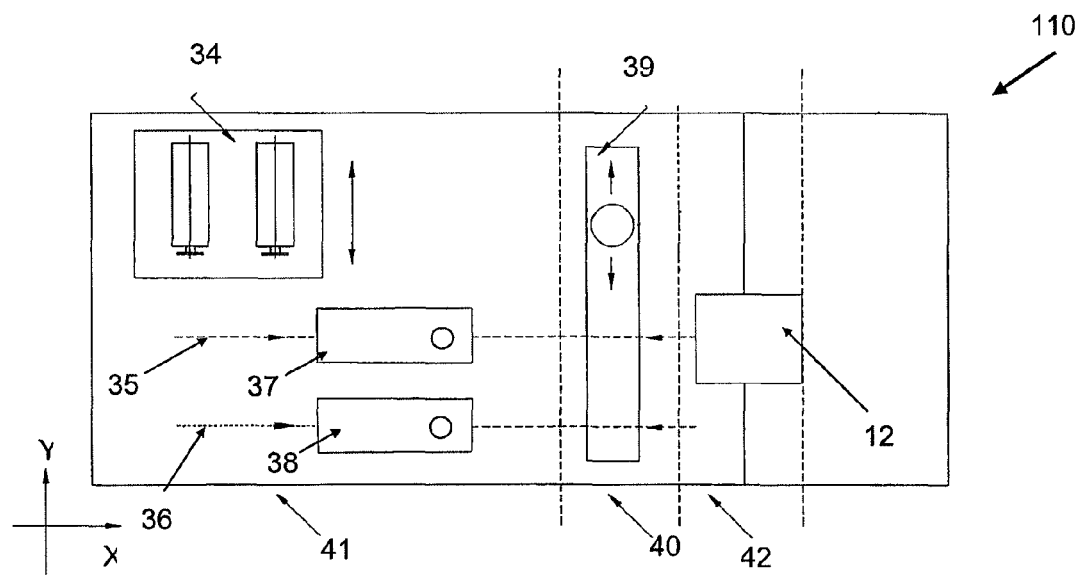
FIG. 2 is a functional block diagram illustrating a conventional bi-directional singulation system with a vision alignment zone located between a singulation zone and a loading/unloading zone.
Figure 3:
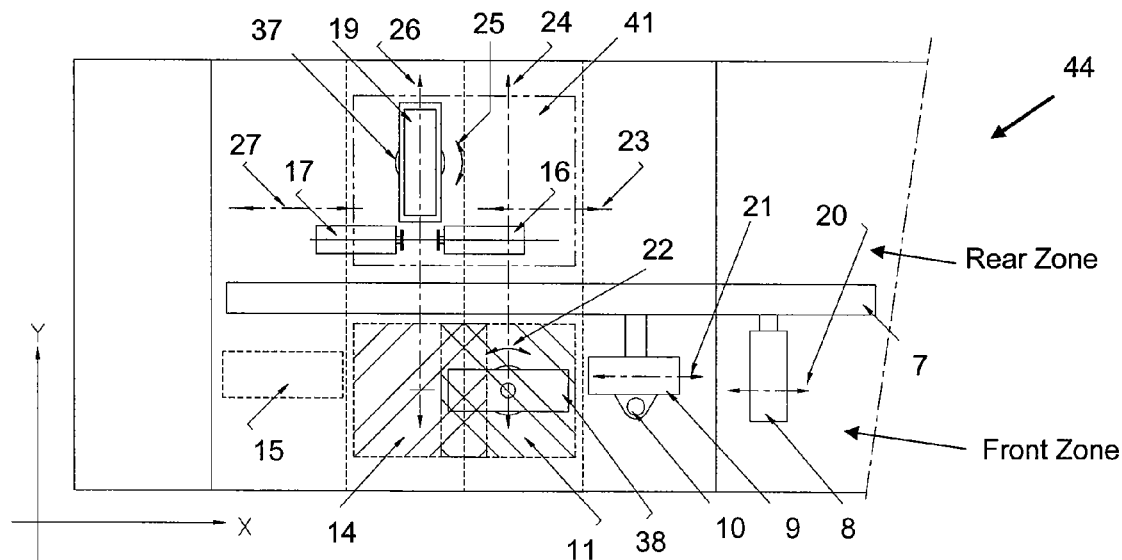
FIG. 3 is a functional block diagram illustrating a bi-directional singulation system according to the preferred embodiment of the invention incorporating a vision alignment system.

FIG. 3 is a functional block diagram of a bi-directional singulation system 44 according to the preferred embodiment of the invention incorporating a vision alignment system. There are two zones in the singulation system 44, namely a front zone and a rear zone. Substrate loading/unloading and vision alignment of semiconductor substrates on a carrier mechanism are completed in the front zone. Singulation of semiconductor substrates is carried out in the rear zone.

In the front zone, the singulation system 44 generally comprises a substrate input zone 15, a loading zone which may be comprised of loading/unloading zones 11, 14, a loader such as a substrate loading head 9 and an unloader such as a singulated units unloading head 8. The substrate loading head 9 is movable along an x-axis 21 to place substrates onto the carrier mechanism. A vision system comprising a vision alignment camera 10 is movable along substantially the same axis as the substrate loading head 9 and is located in the front zone. The rear zone generally has a singulation zone 41 comprising dual spindles 16, 17 for singulation of electronic components by sawing.

The substrate loading head 9 may also act as a vision alignment head for mounting the vision alignment camera 10. The vision alignment camera 10 may thus be mounted on the substrate loading head 9, which may further be attached to a loading/unloading arm 7 such that the substrate loading head 9 and vision alignment camera 10 are movable on the arm 7. Since the substrate loading head 9 and the vision alignment camera 10 are mounted onto the loading/unloading arm 7, they are restricted to movement only along one axis, namely the illustrated x-axis 21. Alternatively, the vision alignment camera 10 may be mounted on the singulated units unloading head 8, or even be separate from both the substrate loading head 9 and the singulated units unloading head 8. The advantage of the vision alignment camera 10 being movable along substantially the same axis as the substrate loading head 9 is that an additional motion axis for the vision system can be avoided.

The carrier mechanism preferably comprises at least two work chucks, such as chuck tables 37, 38, and a saw jig mounted on each chuck table 37, 38. Each chuck table 37, 38 receives and holds a semiconductor substrate 19 and is operative to move the substrate 19 along an axis that is substantially perpendicular to the aforesaid movement axis of the substrate loading head 9 and the vision alignment camera 10. The chuck tables 37, 38 are preferably driven independently and are reciprocally movable between the loading/unloading and singulation zones at the front and rear of the singulation system 44 respectively.

The substrate input zone 15 receives a semiconductor substrate 19 from an upstream process, and it is in turn picked up by the substrate loading head 9 carrying the vision alignment camera 10. The substrate loading head 9 places the semiconductor substrate 19 onto the saw jig on one of the dual chuck tables 37, 38 in the loading/unloading zones 11, 14. For pre-alignment purposes, the vision alignment camera 10 obtains one or more images of the semiconductor substrate 19 showing alignment information while the semiconductor substrate 19 is in the loading zone.

With such an arrangement, the area for vision alignment occupies the same area as the loading position. This eliminates an additional motion axis for the vision alignment camera 10, thus reducing cost and space requirements. Furthermore, vision alignment is conducted within the vicinity of the loading/unloading zones 11, 14 without having to move the substrate to a separate vision alignment station, thus reducing cycle time.

After the semiconductor substrate 19 is placed onto the saw jig of one of the chuck tables 37, 38 by the substrate loading head 9 movable on the loading/unloading arm 7, it is held onto the saw jig firmly by vacuum before moving in the y-axis. The vision alignment camera 10 on the substrate loading head 9 takes at least one image of alignment information such as fiducial marks on the semiconductor substrate 19 for alignment and compensation purposes during the subsequent cutting process. The image is obtained when the substrate loading head 9 and the vision alignment camera 10 are positioned by moving along the x-axis 21 while the semiconductor substrate 19 is positioned by moving along the y-axis 24, 26 for viewing such alignment information.

After vision alignment, the first or second chuck table 37, 38 holding the saw jig carrying the semiconductor substrate 19 moves to the singulation zone 41 in the rear zone for cutting by a singulation system comprising dual spindles 16, 17, each with a sawing blade. The dual spindles 16, 17 are arranged facing each other and are movable along separate x-axis paths 23, 27. It should be appreciated that the singulation system may comprise either a single spindle or dual spindles arranged in parallel. In general, the arrangement of dual spindles 16, 17 facing each other gives higher output. The spindles 16, 17 rotate at high speed for cutting the semiconductor substrate 19 into separated components of a predetermined size utilizing the compensation data collected during the vision alignment step.

After the semiconductor substrate 19 has been cut into singulated components, the chuck table 37, 38 with the saw jig carrying the singulated semiconductor substrate 19 moves to the front zone. The singulated units unloading head 8 unloads the singulated units from one of the chuck tables 37, 38 situated in one of the loading/unloading zones 11, 14. The singulated units unloading head 8 is mounted onto the same loading/unloading arm 7 as the substrate loading head 9 is but is driven separately in the x-axis 20. Next, the singulated packages are transferred from the saw jig to a downstream process, such as a sorting and package inspection process.

In FIG. 3, the second chuck table 38 is in the loading/unloading zone 11 awaiting the loading of the semiconductor substrate 19 onto its saw jig while the first chuck table 37 is in the rear zone awaiting cutting of the semiconductor substrate 19 on its saw jig. The use of two chuck tables 37, 38 allows the non-singulation processes (including loading/unloading and vision alignment) and the singulation process to be carried out simultaneously. As a result, the dual spindles 16, 17 have minimal idling time so that increased output of the singulation system can be achieved. It should however be noted that the vision alignment system according to the invention can be operated with a single chuck table instead of dual chuck tables.

Figure 4A:
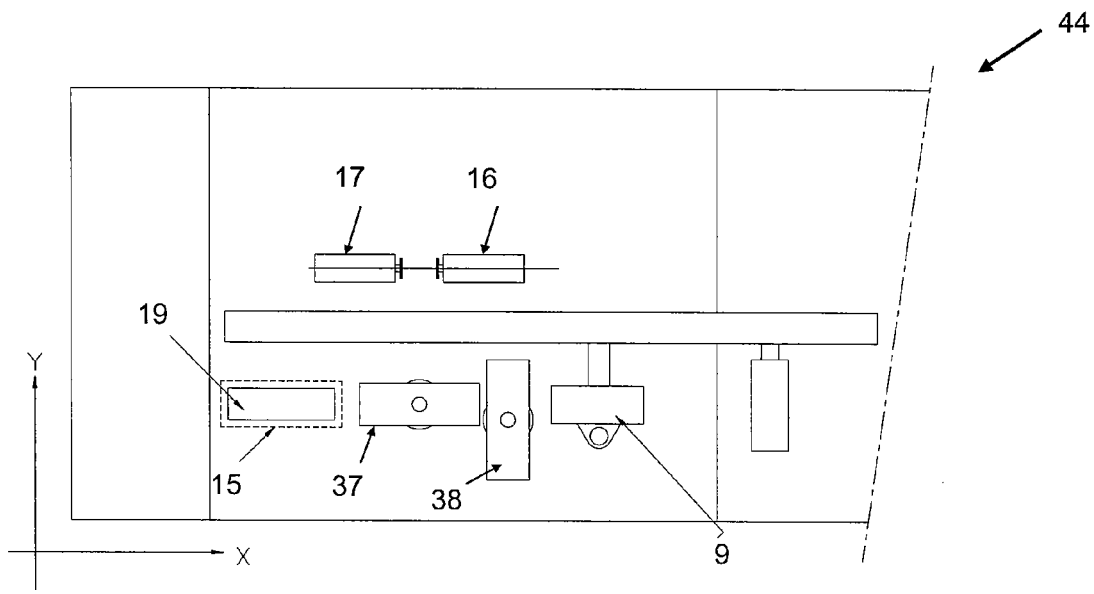
FIGS. 4A to 4N are functional block diagrams illustrating an exemplary handling sequence of the bidirectional singulation system of FIG. 3.
Figure 4B:
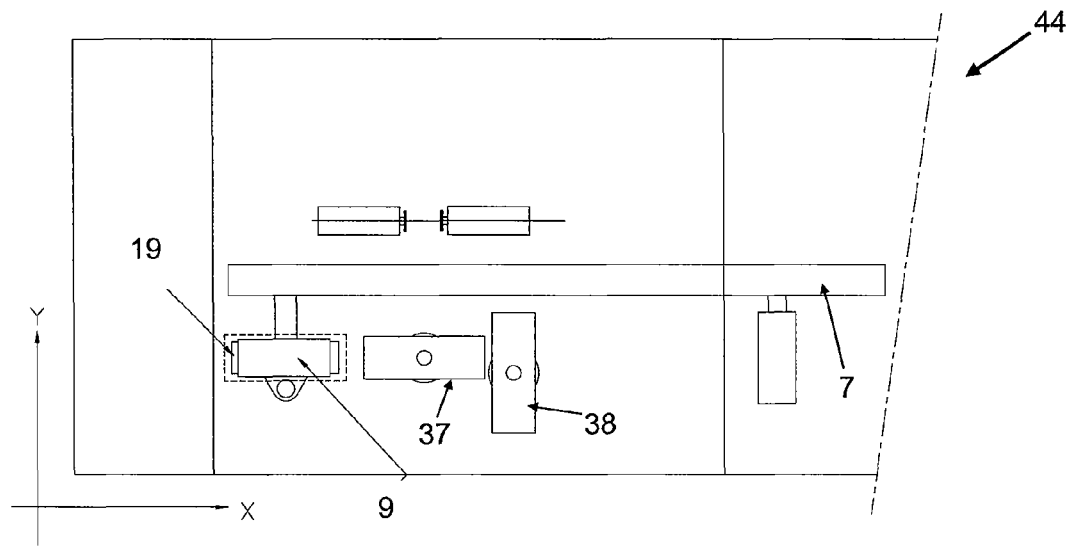
Figure 4C:
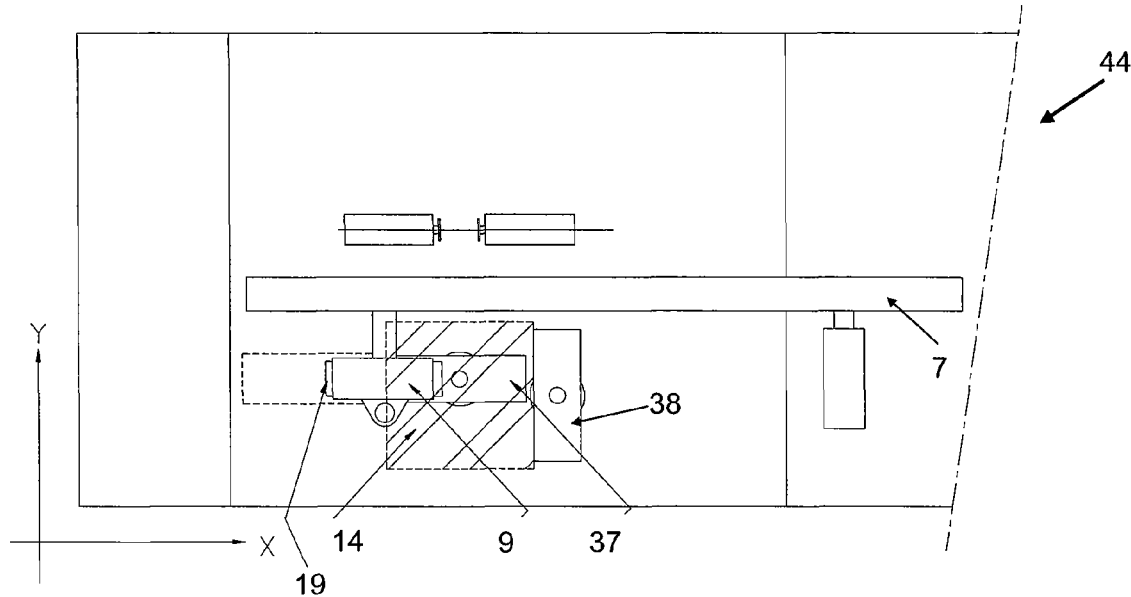
Figure 4D:
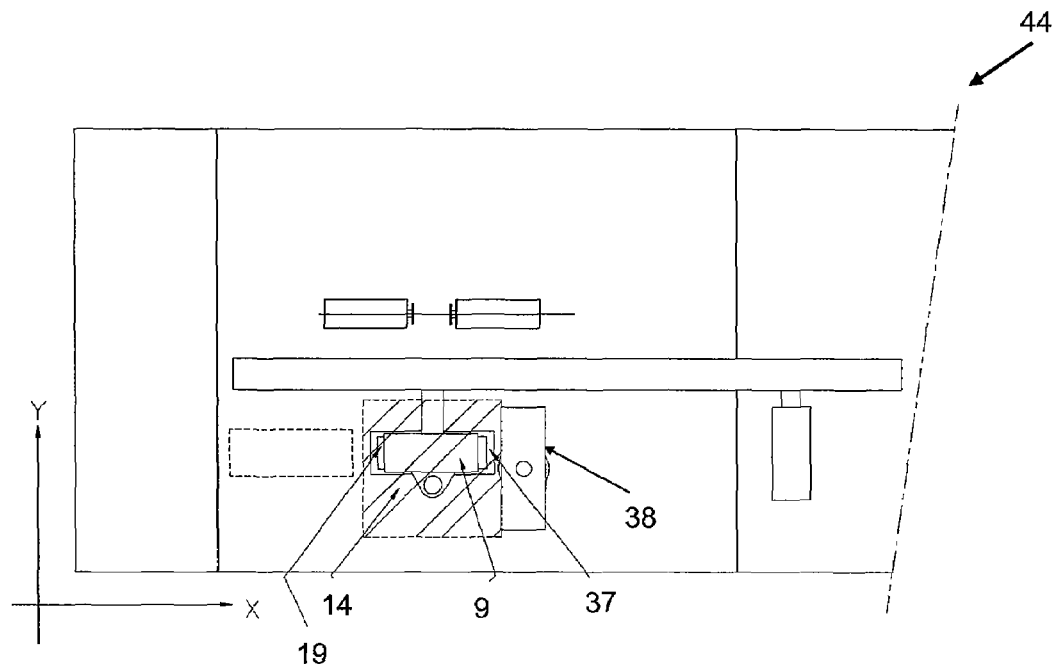
Figure 4E:
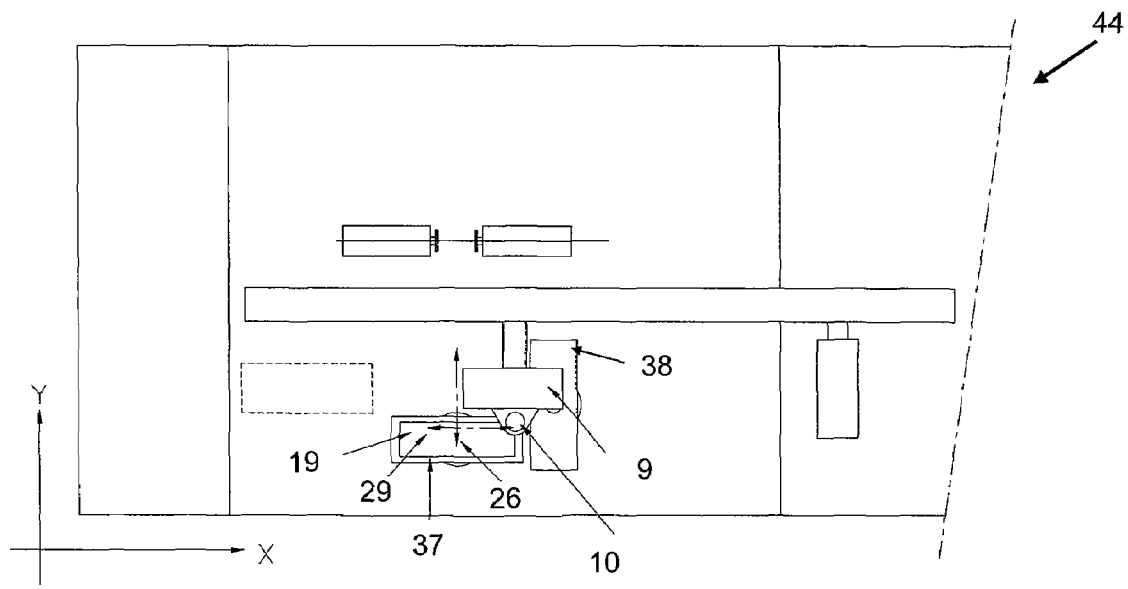
Figure 4F:
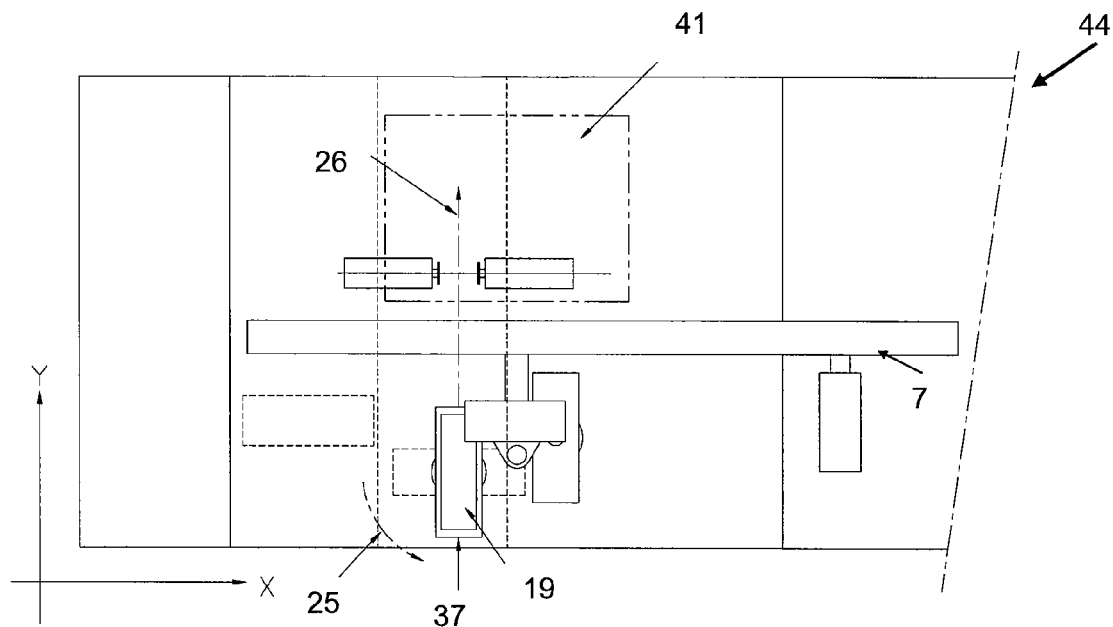
Figure 4G:
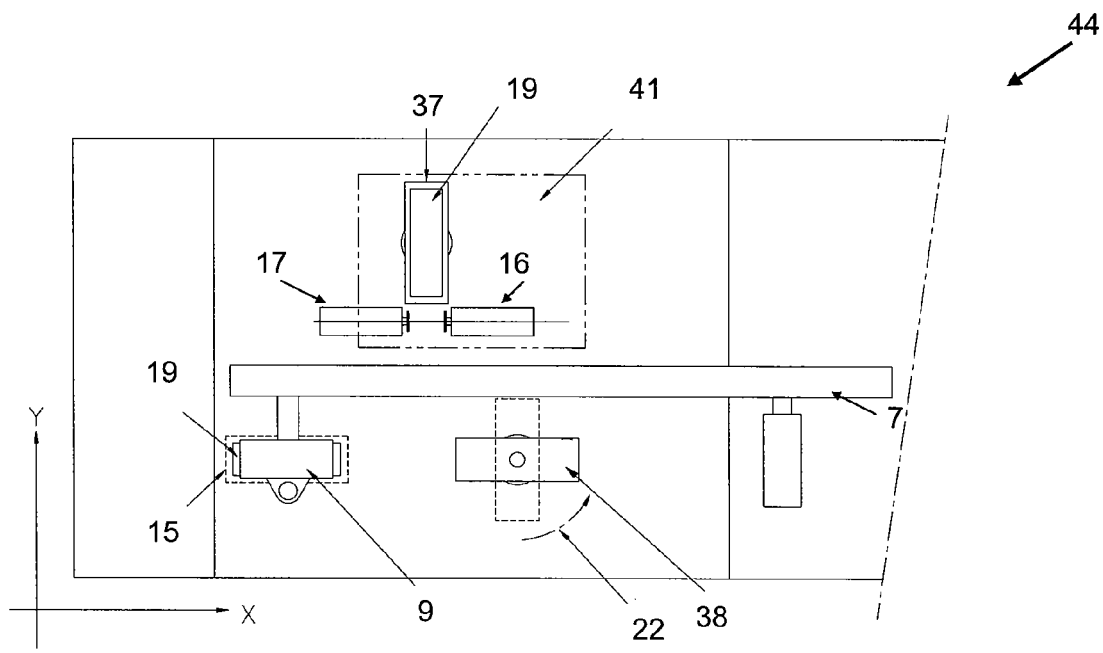
Figure 4H:
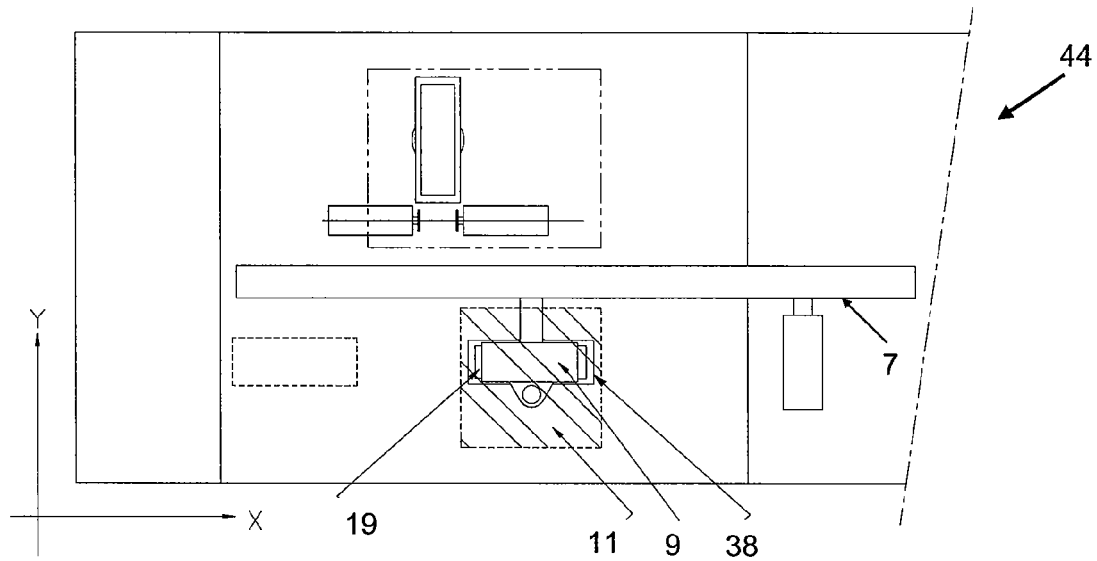
Figure 4I:
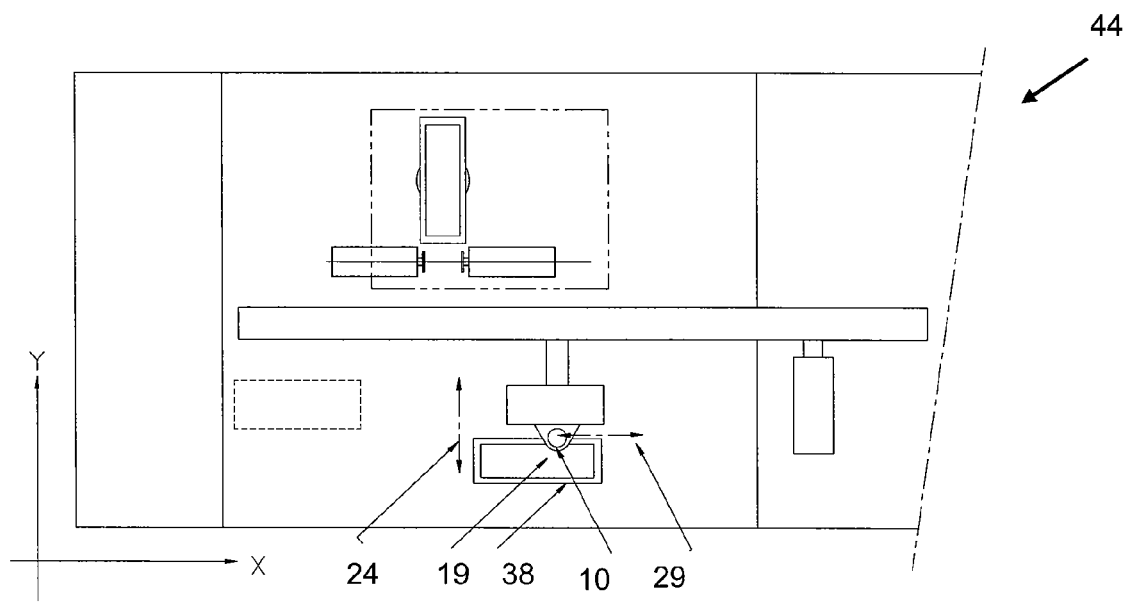
Figure 4J:
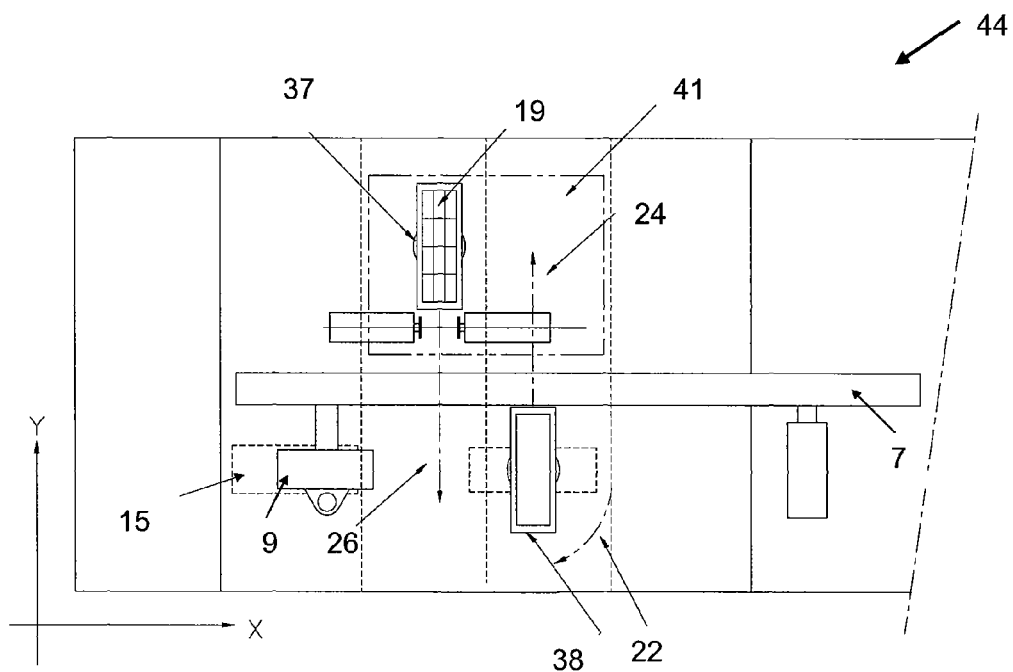
Figure 4K:
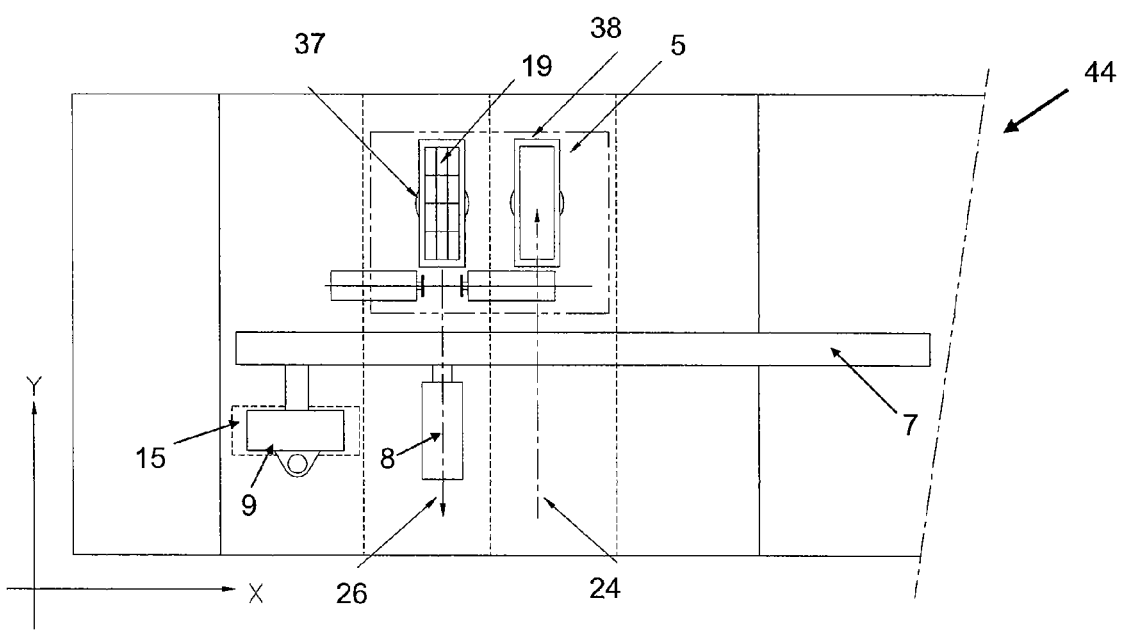
Figure 4L:
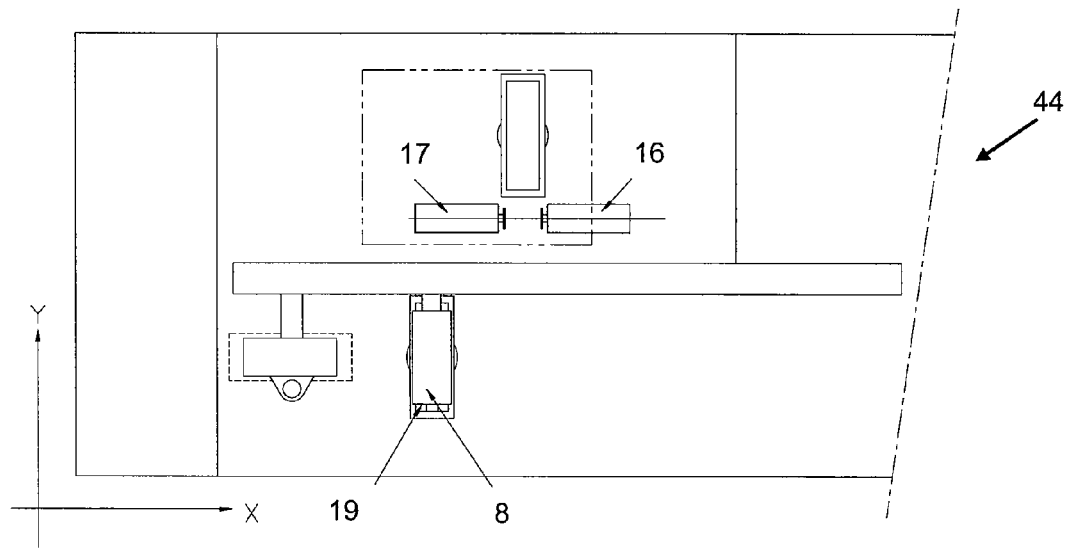
Figure 4M:
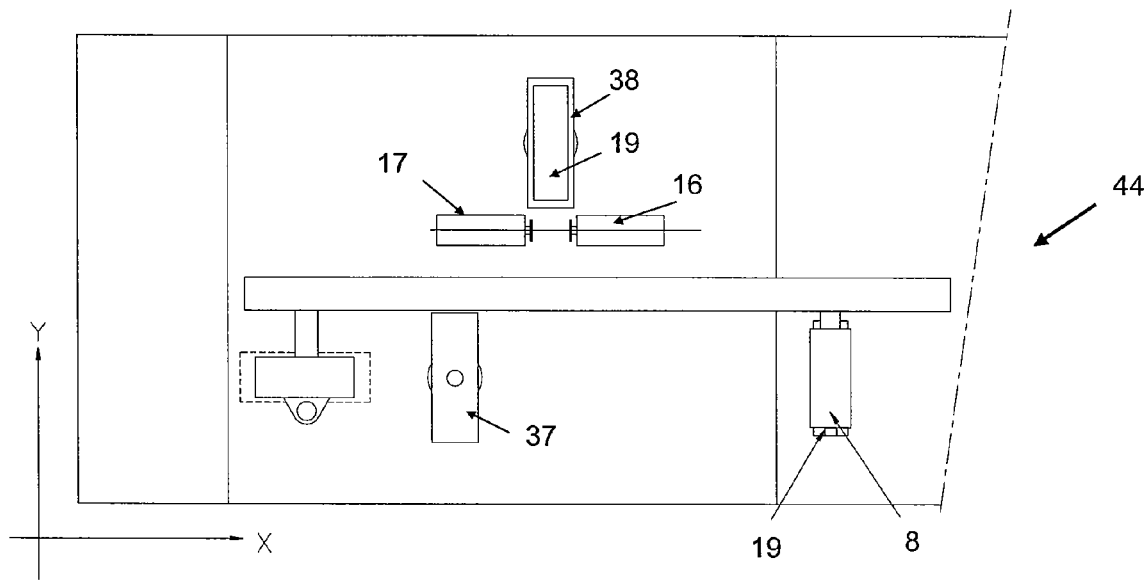
Figure 4N:
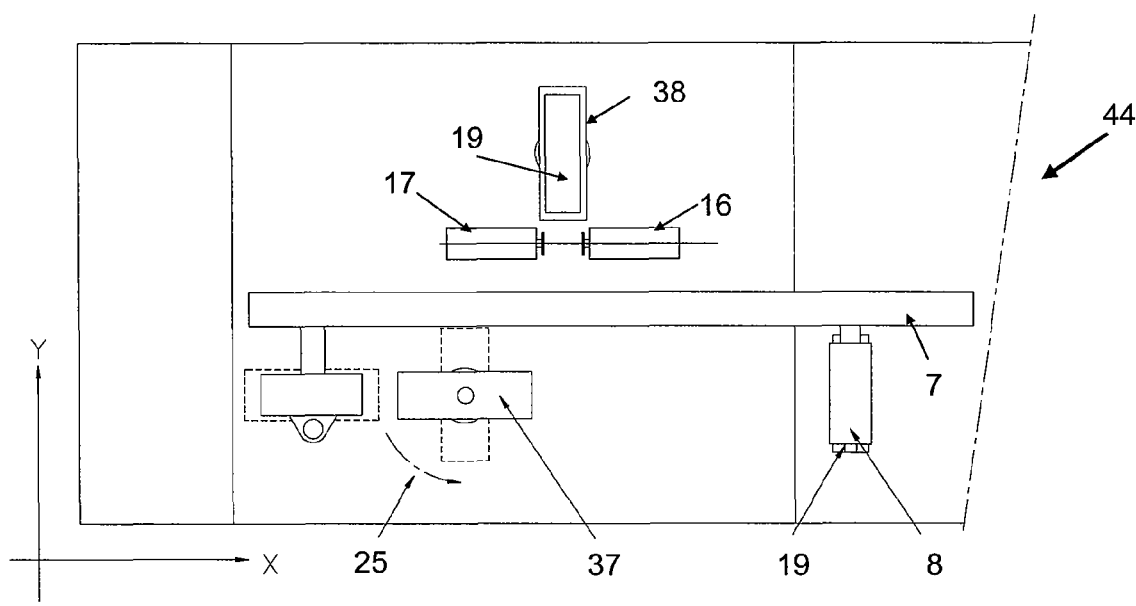

FIG. 4A to 4N are functional block diagrams illustrating an exemplary handling sequence of the bidirectional singulation system of FIG. 3.

In FIG. 4A, a semiconductor substrate 19 is in the substrate input zone 15 and both the chuck tables 37, 38 are stationed in the loading/unloading zones 11, 14. The second chuck table 38 is in a Y orientation to free up space for the first chuck table 37 which is in an X orientation for receiving the semiconductor substrate 19.

FIG. 4B illustrates the transfer of the semiconductor substrate 19 onto the substrate loading head 9. The substrate loading head 9 is moved on the loading/unloading arm 7 along the x-axis 21 into the substrate input zone 15 to pick up the semiconductor substrate 19.

In FIG. 4C, the semiconductor substrate 19 is being transferred onto the saw jig on the first chuck table 37. The loading/unloading arm 7 moves the substrate loading head 9 carrying the semiconductor substrate 19 to the first chuck table 37 in the loading/unloading zone 14. The semiconductor substrate 19 is then placed onto the saw jig of the first chuck table 37.

In FIG. 4D, the transfer of the semiconductor substrate 19 onto the saw jig on the first chuck table 37 in the loading/unloading zone 14 is completed.

FIG. 4E illustrates the imaging of the fiducial marks on the semiconductor substrate 19 for alignment and compensation for subsequent singulation in the rear zone. As the first chuck table 37 moves along the y-axis 26, the camera 10 mounted on the substrate loading head 9 moving in the x-axis 29 captures the fiducial marks of the semiconductor substrate 19 held on the saw jig of the first chuck table 37. The fiducial marks are typically located at one or more corners of the semiconductor substrate 19.

FIG. 4F illustrates the first chuck table 37 in the Y orientation for moving into the rear zone after vision alignment. After vision alignment of the semiconductor substrate 19, the first chuck table 37 carrying the semiconductor substrate 19 on its saw jig rotates from an X orientation to a Y orientation to move linearly along the y-axis 26 to the rear zone.

As the first and second chuck tables 37, 38 are operative to rotate the semiconductor substrate 19 in the rotational directions 22 and 25, vision alignment of the substrate 19 can be conducted along two orthogonal axes. Therefore, after vision alignment of the semiconductor substrate 19 in the X orientation, the first chuck table 37 may rotate by 90 degrees to a Y orientation to conduct vision alignment of the semiconductor substrate 19 in the Y orientation. Vision alignment of the semiconductor substrate 19 in both the X and Y orientations helps to reduce any orthogonal error between the loading/unloading arm 7 in the x-axis and the first chuck table 37 in the y-axis. After completing vision alignment, the first chuck table 37 moves to the rear zone for singulation.

In FIG. 4G and FIG. 4H, the first chuck table 37 with the semiconductor substrate 19 is located in the singulation zone 41 of the rear zone. The loading/unloading arm 7 moves the substrate loading head 9 to carry another semiconductor substrate 19 to the second chuck table 38 in the loading/unloading zone 11 while singulation of the first semiconductor substrate 19 is carried out by the dual spindles 16, 17. The second chuck table 38 may rotate from a Y orientation to an X orientation when there is sufficient clearance after the first chuck table 37 moves into the rear zone, to be ready to be moved to the singulation zone 41.

In FIG. 4I, imaging of the fiducial marks on the semiconductor substrate 19 is carried out for the purpose of alignment and compensation for the subsequent singulation in the rear zone. The vision alignment camera 10 obtains one or more images of the fiducial marks on the substrate 19 on the second chuck table 38 for alignment while at the same time, the substrate on the first chuck table 37 is being cut in the singulation zone 41. Positioning the substrate for vision alignment is conducted by moving the second chuck table 38 along the y-axis 24 and the camera 10 on the substrate loading head 9 in the x-axis 29.

As seen in FIG. 4J, the second chuck table 38 is in a Y orientation for moving into the rear zone. After vision alignment of the semiconductor substrate 19, the second chuck table 38 carrying the semiconductor substrate 19 on its saw jig rotates from an X orientation to a Y orientation while moving linearly along the y-axis 24 to the rear zone. At the same time, the semiconductor substrate 19 on the first chuck table 37 has been singulated into rectangular units and is conveyed back to the front zone. The loading/unloading arm 7 also moves the substrate loading head 9 to the substrate input zone 15 to pick up another semiconductor substrate 19.

FIG. 4K illustrates both the chuck tables 37, 38 in the rear zone. The second chuck table 38 stands by at the singulation zone 41 of the rear zone and the substrate loading head 9 stands by in the substrate input zone 15. Singulation of the semiconductor substrate 19 on the first chuck table 37 has been completed and the singulated units unloading head 8 stands by along the y-axis 26 to receive the singulated semiconductor substrate 19.

In FIG. 4L, the singulated semiconductor substrate 19 is transferred onto the singulated units unloading head 8. The dual spindles 16, 17 move in the x direction to align with the substrate 19 on the second chuck table 38. Thereafter, the dual spindles 16, 17 cut the semiconductor substrate 19 on the saw jig with the positions learnt and compensated for according to the vision alignment information obtained in the front zone.

FIG. 4M illustrates the transfer of the singulated packages from the singulated units unloading head 8 to a downstream process, such as a sorting and package inspection process. At the same time, the semiconductor substrate 19 on the second chuck table 38 is being singulated in the rear zone.

Lastly, FIG. 4N illustrates the first chuck table 37 rotating from a Y orientation to an X orientation ready to receive another semiconductor substrate 19 from the substrate loading head 9. The cycle of receiving a semiconductor substrate 19 onto a saw jig on a chuck table 37, 38 in the front zone, imaging of the substrate 19 to obtain alignment information, moving it into the rear zone for singulation and thereafter moving the singulated substrate 19 back into the front zone for unloading by the singulated units unloading head 8 is repeated.

It should be appreciated that the vision assisted singulation system 44 in accordance with the preferred embodiment of the invention has the advantage that the vision alignment camera 10 which is mounted onto the substrate loading head 9 allows the vision system to be located in the front zone that is away from the singulation region in the rear zone. As the semiconductor substrate 19 does not pass through the singulation zone 41, it remains clean and dry. The cycle time is also reduced since the semiconductor substrate 19 does not need to move to a separate vision station. Additionally, since a separate motion axis for the vision alignment camera 10 is not necessary, the singulation system 44 is more cost effective and space constraint is reduced.

Moreover, the camera 10 checks the orientation of the semiconductor substrate 19 before it is loaded into the singulation zone 41 for singulation, so the loading of a wrongly oriented substrate and wastage of cycle time are minimized. The use of the dual chuck tables 37, 38 also means that the processes for one of the chuck tables in the front zone (including loading/unloading and vision alignment) may proceed simultaneously with the singulation process at the rear zone for the other chuck table. As a result, idling of the sawing spindles is minimized, and the output increases.

The invention described herein is susceptible to variations, modifications and/or additions other than those specifically described and it is to be understood that the invention includes all such variations, modifications and/or additions which fall within the spirit and scope of the above description.

The invention claimed is:

1. Singulation handler comprising:
a loading zone where a carrier mechanism receives and holds a semiconductor substrate;
a singulation zone where the semiconductor substrate held by the carrier mechanism is singulated;
a rotational device for rotating the carrier mechanism;
a loader that is configured to move along a linear axis for placing the semiconductor substrate onto the carrier mechanism when it is situated in the loading zone; and
a vision system mounted on the loader, the vision system being configured to obtain at least one image of the semiconductor substrate showing alignment information of the semiconductor substrate, the vision system obtaining the at least one image of the semiconductor substrate after the semiconductor substrate is placed on the carrier mechanism and while the semiconductor substrate is in the loading zone,
wherein the carrier mechanism is rotated by the rotational device from a first orientation to a second orientation, the carrier mechanism being in the first orientation while the vision system obtains the at least one image of the semiconductor substrate, the rotation of the carrier mechanism by the rotational device from the first orientation to the second orientation occurring after the vision system obtains the at least one image of the semiconductor substrate, and the carrier mechanism being in the second orientation while it moves into the singulation zone.

2. Singulation handler as claimed in claim 1, wherein the loader is mounted onto an arm that restricts the loader to movement along the linear axis.

3. Singulation handler as claimed in claim 2, wherein the carrier mechanism is configured to move the semiconductor substrate along another axis that is perpendicular to the linear axis along which the loader is configured to move.

4. Singulation handler as claimed in claim 1, wherein the carrier mechanism comprises at least two work chucks, each of which holds a semiconductor substrate, the work chucks being configured to reciprocally move between the loading and singulation zones.

5. Singulation handler as claimed in claim 4, wherein the work chucks are driven independently.

6. Singulation handler as claimed in claim 5, wherein the vision system is configured to obtain the at least one image of a semiconductor substrate on a first work chuck for alignment while another semiconductor substrate on a second work chuck is being singulated in the singulation zone.

7. Singulation handler as claimed in claim 1, wherein the carrier mechanism is configured to rotate the semiconductor substrate and the vision system is configured to perform imaging of the semiconductor substrate along two orthogonal axes.

8. Singulation handler comprising:
a loading zone where a carrier mechanism receives and holds a semiconductor substrate;
a singulation zone where the semiconductor substrate held by the carrier mechanism is singulated;
a rotational device for rotating the carrier mechanism;
a loader that is configured to move along a linear axis for placing the semiconductor substrate onto the carrier mechanism when it is situated in the loading zone; and
a vision system mounted on the loader, the vision system being configured to obtain at least one image of the semiconductor substrate showing alignment information of the semiconductor substrate, the vision system obtaining the at least one image of the semiconductor substrate while the semiconductor substrate is in the loading zone, and
further comprising an unloader that is separate from the loader, the unloader being configured to move along the linear axis along which the loader is configured to move and to unload the semiconductor substrate from the carrier mechanism in the loading zone,
wherein the carrier mechanism is rotated by the rotational device from a first orientation to a second orientation, the carrier mechanism being in the first orientation while the vision system obtains the at least one image of the semiconductor substrate, the rotation of the carrier mechanism by the rotational device from the first orientation to the second orientation occurring after the vision system obtains the at least one image of the semiconductor substrate, and the carrier mechanism being in the second orientation while it moves into the singulation zone.

9. Singulation handler as claimed in claim 8, wherein the unloader and the loader are mounted onto one arm, but the unloader is driven separately from the loader.

* * * * *